(12) United States Patent
Chandrakumar et al.

(10) Patent No.: US 6,472,874 B1
(45) Date of Patent: Oct. 29, 2002

(54) EPR IMAGING DEVICE USING MICROWAVE BRIDGE TRANSLATOR

(75) Inventors: Narayanan Chandrakumar, Chennai (IN); Kassey Victor Babu, Chennai (IN); Visalakshi Vijayaragavan, Chennai (IN)

(73) Assignee: Council of Scientific and Industrial Research, New Delhi (IN)

( * ) Notice: Subject to any disclaimer, the term of this patent is extended or adjusted under 35 U.S.C. 154(b) by 43 days.

(21) Appl. No.: 09/695,241

(22) Filed: Oct. 25, 2000

(30) Foreign Application Priority Data

Sep. 1, 2000 (IN) ...................... 789/DEL/2000

(51) Int. Cl.[7] .................................................. G01V 3/00
(52) U.S. Cl. ........................ 324/316; 324/318; 324/309; 324/300
(58) Field of Search ................................ 324/300, 318, 324/322, 321, 316, 309; 600/422; 333/219; 356/350

(56) References Cited

U.S. PATENT DOCUMENTS 6,133,733 A * 10/2000 Alecci et al. ................ 324/309

OTHER PUBLICATIONS

Szczepaniak et al., Journal of Magnetic Resonance, Series A, 104, 1993, "ESR Imaging Based on the ModulationField Phase", pp. 315–320.

* cited by examiner

*Primary Examiner*—Edward Lefkowitz
*Assistant Examiner*—Brij B. Shrivastav
(74) *Attorney, Agent, or Firm*—Venable; Ann S. Hobbs

(57) ABSTRACT

A device is described which permits the acquisition of Electron Paramagnetic Resonance Images without employing additional hardware for generation of magnetic field gradients. It incorporates a module for translation of the bridge-circulator-resonator-detector assembly in order to locate the resonator at an optimal off-center position in the magnet and employs the inherent gradient in the magnetic field, permitting operation with gradients of 5 T m$^{-1}$ or higher, in continuous wave or pulsed mode.

10 Claims, 9 Drawing Sheets

EPR IMAGING DEVICE USING MICROWAVE BRIDGE TRANSLATOR

FIELD OF INVENTION

The present invention relates to a device for Electron Paramagnetic Resonance Imaging. The device of the present invention has potential use in one-, two- or three-dimensional Electron Paramagnetic Resonance (EPR) Imaging. It has potential application in leather industry for detecting the presence and distribution of chromium in leather. The device may also be used in the drugs, pharmaceuticals and cosmetics industry. It is also envisaged to have use for detecting the presence and distribution of radicals including the nitroxide radical in metabolites for medical purpose. Further, it has potential application in mineralogical applications and in foodstuffs industry.

BACKGROUND OF INVENTION

Electron Paramagnetic Resonance (EPR), which is also known as Electron Spin Resonance (ESR), is a technique of radiofrequency (rf)/microwave spectroscopy that detects free radicals, certain transition metal complexes, certain rare earth metal complexes, triplet state molecules and the like, by virtue of the presence of unpaired electrons in such species ('spins'). The measurement is performed by locating the sample of interest (usually liquid or solid) in a suitable resonator (e.g. cavity, slow wave structure, etc.) placed in a spatially homogeneous magnetic field and irradiating it with electromagnetic (em) radiation whose frequency matches the characteristic precession frequency of the electron spins in the external field, the resonance frequency being given by the equation $$\omega_0 = \frac{g\beta}{\hbar} B_0$$

where g is the spectroscopic splitting factor (Lande factor, or simply the g-factor), $\beta$ is the Bohr magneton, $B_0$ is the intensity of the magnetic field and $\hbar$ is Planck's constant divided by $2\pi$. This 'first order' equation for the resonance frequency is usually modified by the addition of other contributory terms involving internal (or local) fields from other unpaired electrons and/or nuclear spins. The resonant absorption (or emission) of em radiation under these conditions is customarily recorded by varying the intensity of the external magnetic field across the resonance condition, holding the frequency of the em radiation constant in continuous wave (cw) mode. In order to minimize dc (direct current) drifts during the course of the field scan and to improve signal-to-noise ratio, it is customary to employ field modulation, typically at 100 Hz to 100 kHz, employing a set of modulation coils mounted in the resonator/cavity and perform phase sensitive detection (PSD) of the output of the em detector (e.g. Diode detector). Normally, EPR measurements are employed to access detailed information about the electronic structure, shape and dynamics of molecular species, the sample and magnetic field being made as homogeneous as possible. The magnetic field is usually generated by a permanent magnet, superconducting electromagnet, or, more frequently, by a resistive electromagnet. The intensity of the field generated by the magnet is usually not higher than 1.5 Tesla (T), although very low fields, of the order of 0.01 T, or very high fields, of the order of 3.4 T may also be employed. Correspondingly, the sample placed in the resonator is irradiated typically with microwaves from a microwave bridge, or with radiofrequency radiation.

In the pulsed mode of operation, the continuous wave (cw) microwave bridge is replaced with a pulsed microwave bridge, the microwaves are amplified with a Traveling Wave Tube (TWT) Amplifier to produce typically upto 1 kWatt of power in pulsed output mode, such microwave pulses then being fed to the resonator. Often a resonator with lower quality factor, Q, is used for pulsed applications, in the interest of reducing the ring-down time ('dead time') of the system, to enable near 'zero time' detection of the resulting ESR signals.

The same basic experiment may be used in quite a different mode, however, to detect macroscopic molecular distributions in an inhomogeneous object. Such a distribution function provides an 'image' of the object in question. The primary emphasis of such a measurement is not molecular structure, but macroscopic molecular distribution. Locating the object of interest in a suitable resonator in a magnetic field that has spatial variation, i.e., gradients, accesses this type of information. Under these conditions, the resonance frequency is given by the equation $$\omega_0 = \frac{g\beta}{\hbar}(B_0 + G \cdot r)$$

where, G indicates gradient vector, while r indicates the position vector in the sample.

The resolution of an EPR image is dependent on a number of parameters, including the intensity of the magnetic field gradient, the intrinsic width of the basic EPR resonance of the species in question (the 'linewidth'), the signal-to-noise ratio per volume element of the sample, molecular diffusion processes, etc. In general, the EPR linewidth is of the order of several Gauss (1 Gauss $\Box$ $10^{-4}$ Tesla), or several Megahertz in frequency units. The resolution R expected on the basis of the first two parameters may be given as:

$$R = \frac{\Delta v_{1/2}}{G}$$

where $\Delta v_{1/2}$ denotes the linewidth and G, the gradient amplitude.

It is customary to generate the gradient by additional sets of anti-Helmholtz or Anderson coils located in the main magnetic field. When currents are passed through such water- or forced air-cooled coils, sizeable gradients may be generated, with amplitude upto about 1 T m$^{-1}$ (100 G cm$^{-1}$). One set of coils is typically employed for each of the three orthogonal directions in space. Because the inverse of the EPR linewidth is typically short compared to gradient switching times, it is customary to acquire the signal in the presence of the gradient, then reorient the sample with respect to the gradient (e.g. by rotating the gradient, adjusting the current amplitudes in two sets of gradient coils) to obtain a two-dimensional image. Reconstruction of the resulting series of 'projections' then yields the desired image.

As reported by Maresch et al (Physica B, 138, 261, 1986), it is possible, under special circumstances, to pulse the gradient and acquire ESR images as in Nuclear Magnetic Resonance (NMR) Fourier imaging. This entails the construction of a special, usually small, gradient coil assembly with low inductance, permitting short gradient pulse rise and fall times, the experiment being then performed with an ESR sample that gives rise to a single sharp resonance (the linewidth being of the order of 20–50 kHz, instead of being in the typical range of 1–10 MHz) in the absence of gradients.

OBJECTIVES OF THE INVENTION

The main objective of the present invention is to provide a device for Electron Paramagnetic Resonance Imaging, which obviates the special requirements, limitations and drawbacks stated above.

Another objective of the present invention is to provide a device for EPR imaging using naturally occurring field gradient.

Yet another objective of the present invention is to provide a device to use a field gradient of amplitude of minimum 5 T/m.

Still another objective of the present invention is to provide a device devoid of gradient coils, gradient amplifiers and the associated cooling system for generating EPR images.

One more objective of the present invention is to provide a device to image EPR samples like nitroxide radicals, having larger linewidth in the range of 1–10 MHz.

Yet another objective of the present invention is to provide a device for imaging on existing cw/pulsed EPR spectrometer/imaging systems, by the addition of a microwave bridge translation module, but without using gradient coils and amplifiers. Still another objective of the present invention is to provide a device to acquire ESR images in cw mode, as well as in pulsed mode of operation.

SUMMARY OF THE INVENTION

The novelty and non-obviousness of the present invention lies in the incorporation of microwave bridge translation module (33), whereby the resonator containing the sample can be placed, unlike in the conventional device where the sample placed in the resonator has necessarily to be put in the center of the magnetic field necessitating additional hardware and control system to generate the gradient, instead at a convenient optimal location in the field ensuring the optimal use of field intensity and the naturally occurring gradient without using the conventional hardware and control system for the imaging application.

BRIEF DESCRIPTION OF THE ACCOMPANYING DRAWINGS

In the drawings accompanying this specification,

Figure 1:
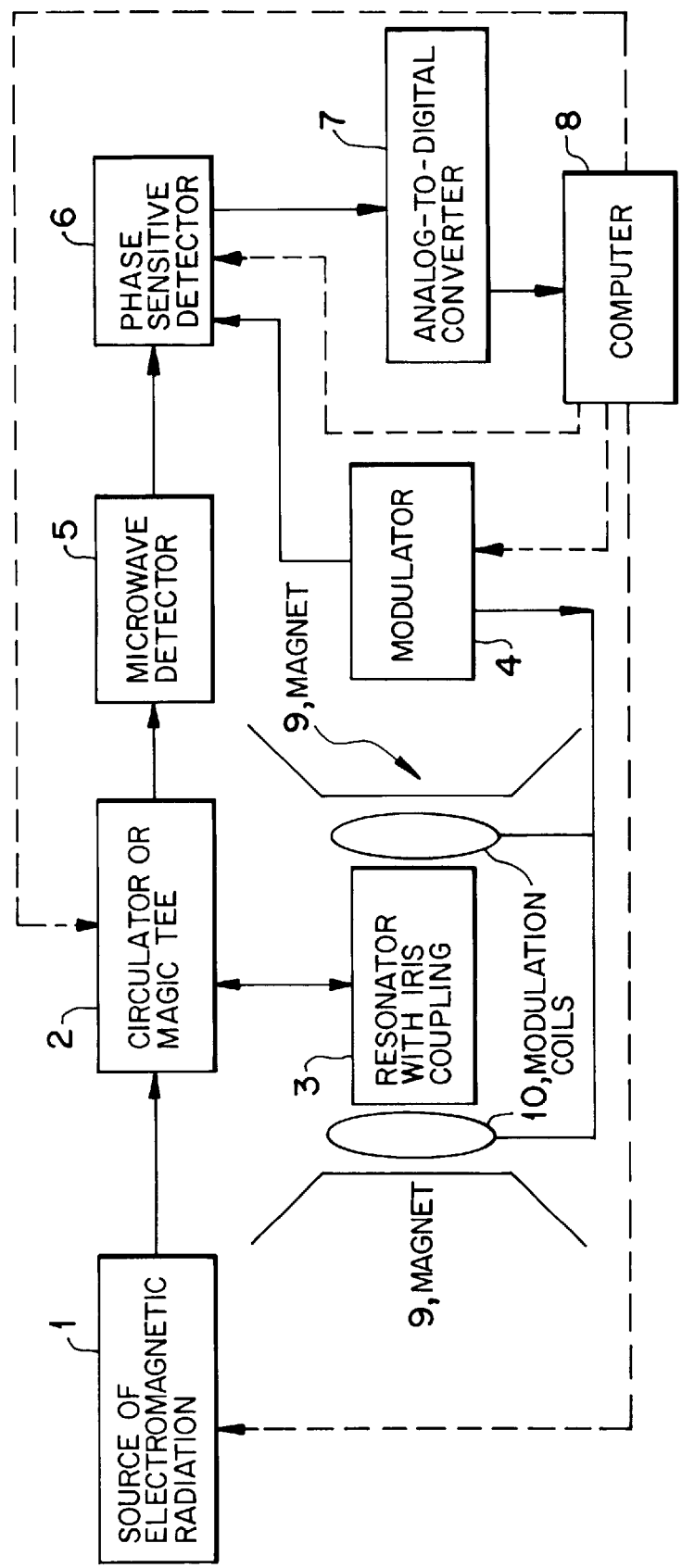
FIG. 1 represents a schematic block diagram of a typical EPR (ESR) spectrometer, conventionally used for measuring EPR.
Figure 2:
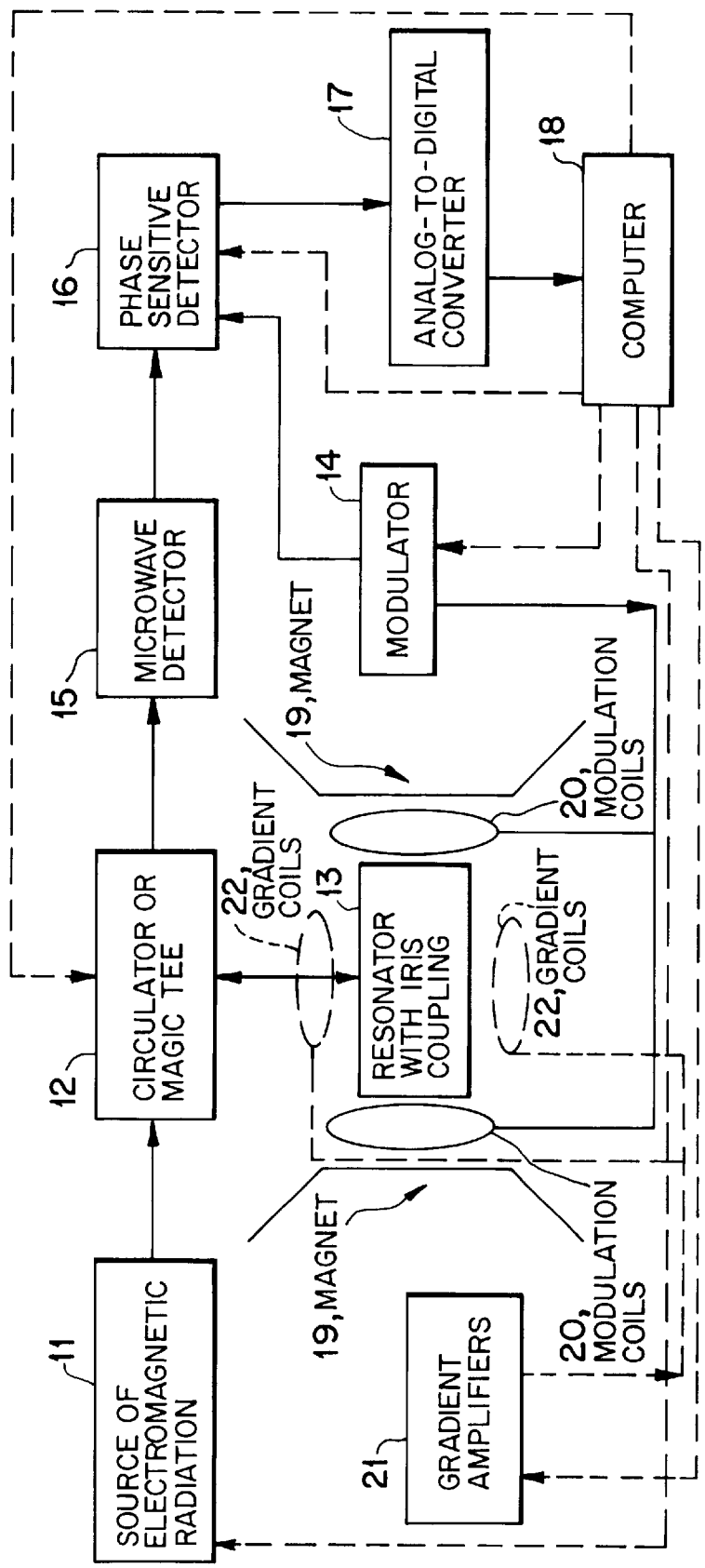
FIG. 2 represents a schematic block diagram of typical EPR (ESR) spectrometer, including one set of gradient coils driven by a gradient amplifier, used for EPR imaging.
Figure 3:
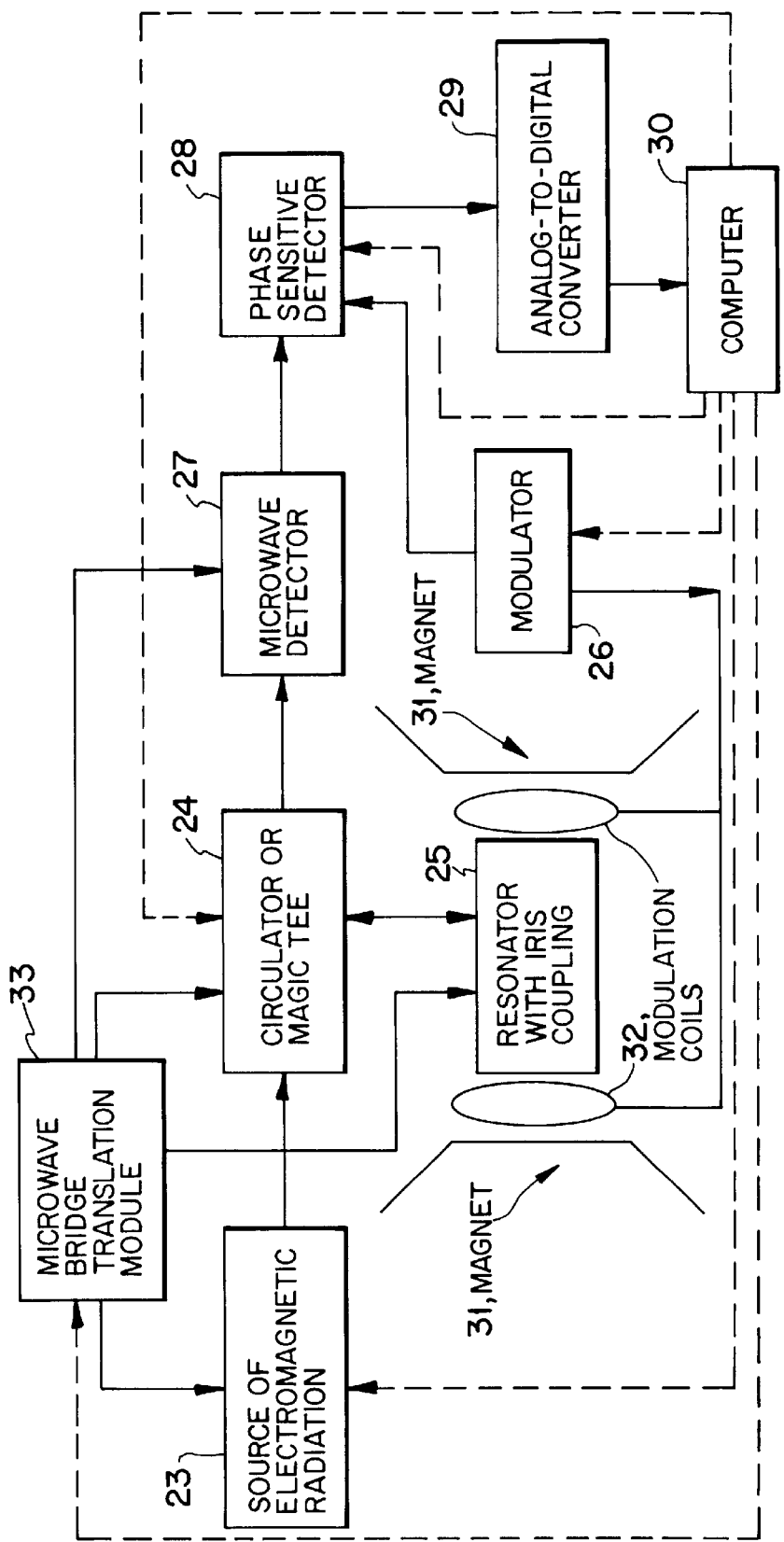
FIG. 3 represents a schematic block diagram of the device of the present invention for EPR imaging with Microwave (MW) bridge translation system.

Different components of FIG. 1 are as follows:
1. refers to source of electromagnetic radiation in the microwave or rf region
2. refers to Circulator or Magic Tee
3. refers to resonator incorporating an iris coupling
4. refers to modulator
5. refers to microwave detector, e.g. diode detector
6. refers to phase sensitive detector (PSD)
7. refers to analog-to-digital converter (ADC)
8. refers to Computer
9. refers to Magnet with North and South pole.
10. refers to modulation coils Different components of FIG. 2 are as follows:
11. refers to source of electromagnetic radiation in the microwave or rf region
12. refers to Circulator or Magic Tee
13. refers to resonator incorporating an iris coupling
14. refers to modulator
15. refers to microwave detector, e.g. diode detector
16. refers to phase sensitive detector (PSD)
17. refers to analog-to-digital converter (ADC)
18. refers to Computer
19. refers to Magnet with North and South pole
20. refers to modulation coils
21. refers to gradient amplifiers
22. refers to gradient coils Different components of FIG. 3 are as follows.
23. refers to source of electromagnetic radiation in the microwave or rf region
24. refers to Circulator or Magic Tee
25. refers to resonator incorporating an iris coupling
26. refers to modulator
27. refers to microwave detector, e.g. diode detector
28. refers to phase sensitive detector (PSD)
29. refers to analog-to-digital converter (ADC)
30. refers to Computer
31. refers to Magnet with North and South pole
32. refers to modulation coils
33. refers to microwave bridge translation module

DETAILED DESCRIPTION OF THE INVENTION

The present invention is described below in detail.

The sample under investigation is placed inside a conventional resonator (25) and oriented with the help of a goniometer. The resonator (25) is located not in the middle of the main magnet (31), but instead, in such a region where the spatial variation of the field is more than 5 T/m. The option of controlled and reproducible translation of the microwave bridge/resonator assembly in two or three orthogonal directions enables location of the same at the desired favorable position in the magnetic field. The resonator (25) is then tuned and matched with the frequency source and the field modulation is set at amplitude lesser than the linewidth of the sample under investigation. The EPR spectral profile of the sample is then recorded by conventional field sweep method. Varying the modulation frequency optimizes the profile. The same process is repeated to get a minimum of 12 profiles each with a different orientation of the sample. These profiles are then processed by the conventional method of projection reconstruction including shift, deconvolution and back projection to generate the desired two or three dimensional images.

Accordingly the present invention provides a device for Electron Paramagnetic Resonance Imaging, comprises a microwave bridge consisting of a source of electromagnetic radiation (23) in the microwave region, and attenuation and phase shift elements, the output of the said source (23) is connected to one arm of a Circulator or Magic Tee (24), another arm of which is coupled to a resonator (25) through an iris coupling, and the third arm being connected to a conventional microwave detector (27), the output of which is connected to one input of a phase sensitive detector (PSD) (28), whose second input is connected to one output of the conventional modulator (26), the second output of which is fed to the modulation coils (32) associated with the resonator (25), the output of the PSD (28) being fed to an analog-to-digital converter (ADC) (29), whose output is connected to a Computer (30), the resonator (25) being placed in the magnetic field between the north pole and the south pole of a magnet (31), the field modulation amplitude (in Gauss) being less than the linewidth of the sample under investigation and the microwave bridge translation module (33) permitting the suitable placement of the bridge (23), circulator (24), resonator (25) and detector (27) in such a way that the resonator (25) is located optimally off-center in the field, the imaging being performed either in cw or in pulsed mode.

In an embodiment of the present invention, the source of electromagnetic radiation used may be such as klystron, Gunn diode oscillator or Impact Avalanche and Transit Time (IMPATT) diode.

In another embodiment of the present invention, the resonator used may be such as slow wave helical structure, dielectric resonator, cylindrical resonator, rectangular resonator or slotted resonator.

In yet another embodiment of the present invention, the microwave detector is a diode detector.

In still another embodiment of the present invention, the means of orienting the sample may be such as manually settable or computer controlled goniometer.

In one more embodiment of the present invention, the reorientation of the sample may be such as to vary polar angle or azimuth angle of the sample with respect to the field.

In yet one more embodiment of the present invention, the minimum number of EPR profiles to be taken for generating the image may be 12.

The following examples are given by way of illustration only and therefore should not be construed to limit the scope of the present invention.

EXAMPLE 1

Figure 4:
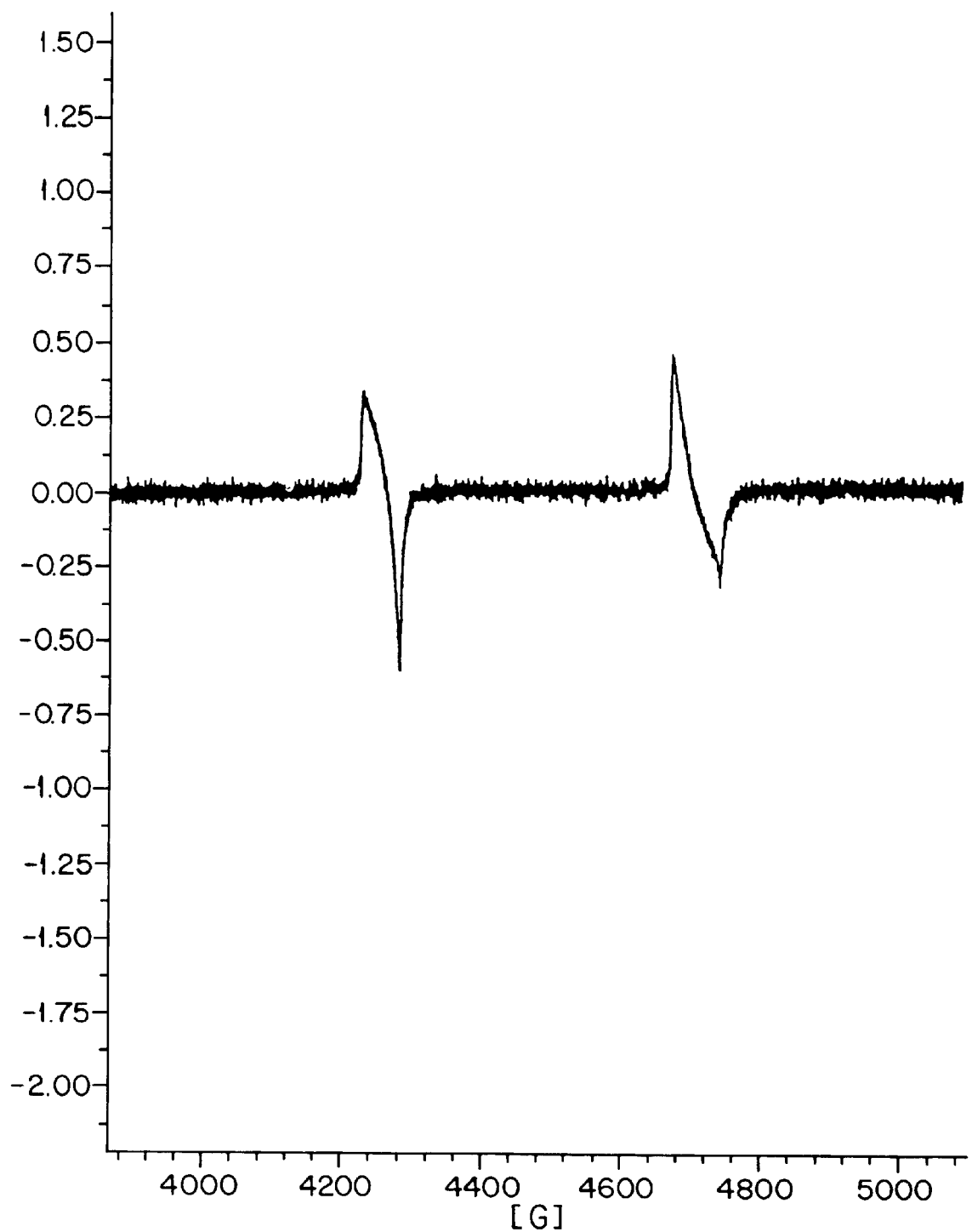
FIG. 4 represents an x-profile of Cr(V) hmba, as per details in Example 1
Figure 5:
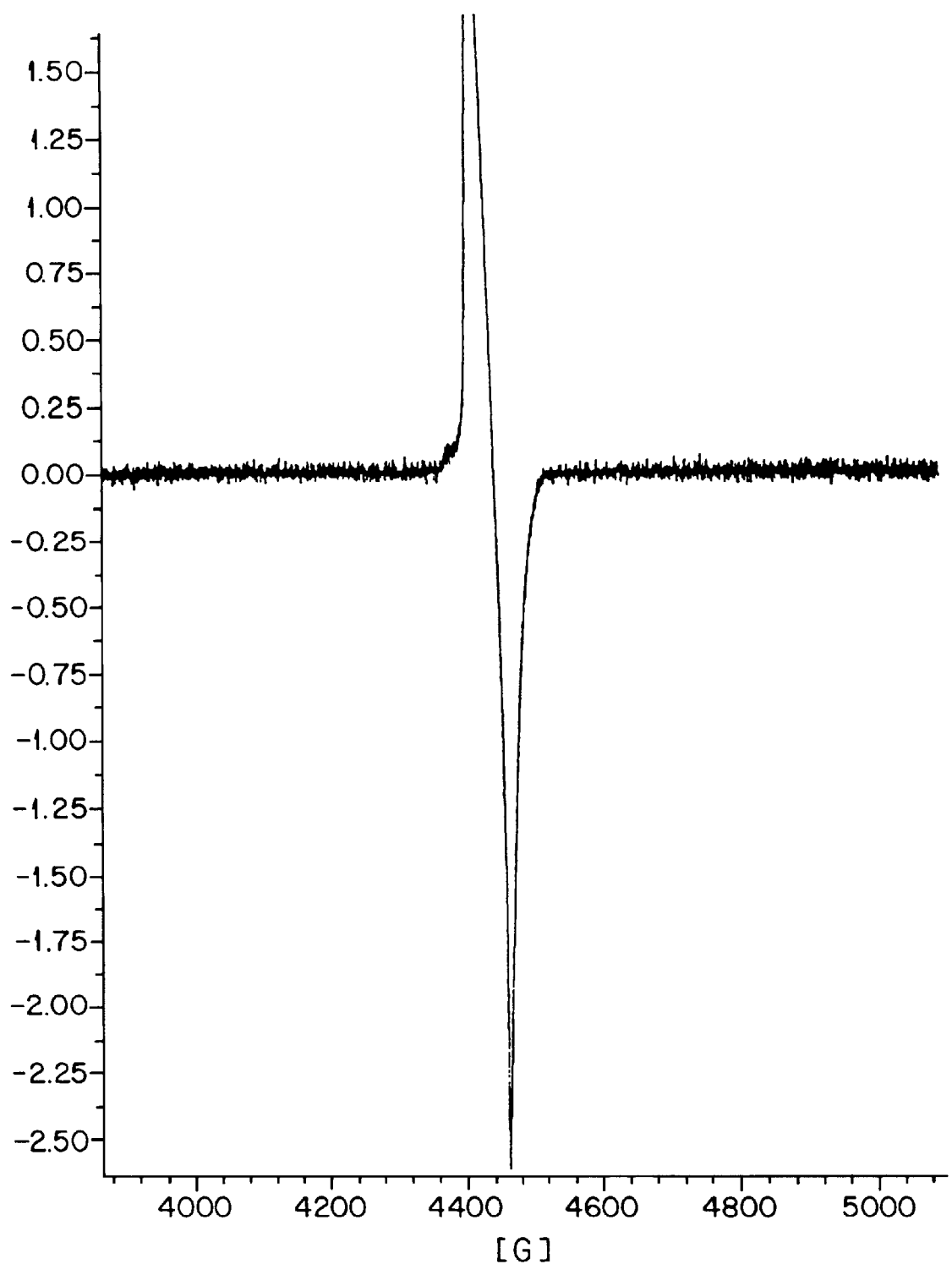
FIG. 5 represents a y-profile of Cr(V) hmba, as per details in Example 1

0.25 ml of Cr (V) hmba (hmba: 2-hydroxy-2-methylbutyric acid) solution was taken in two capillary tubes of diameter 2 mm, two empty tubes of diameter 3 mm were interposed between the said 2 mm tubes, and the entire sample was placed in the standard rectangular $TE_{102}$ cavity resonator of a Bruker EMX 10/2.7 EPR spectrometer parallel to the magnetic field direction z, the field modulation being set to a frequency of 100 kHz and an amplitude of 2.0 G. The resonator was displaced 10 cm from the origin (center of the magnet) in the horizontal x direction, while being centered in the z and vertical y directions. The profile of the sample was obtained. The sample was then reoriented using a manual goniometer to 15° from the z-axis. The process was then repeated 12 times in a similar way, subjecting the sample to a reorientation of 15° each time, thereby getting 12 profiles. The profiles are processable using IDL software to get 2-dimensional image of the sample, in conformity with the morphology of the phantom object. FIG. 4 and FIG. 5 represent typical x- and z-profiles, respectively. The x-profile refers to the sample oriented along the x direction, where all tubes have the same z co-ordinate, but different x co-ordinates, the axes of the tubes being parallel to each other and to y; the x direction is perpendicular to the magnetic field direction z and lies in the horizontal plane. The z-profile refers to the sample oriented along the z direction, where all tubes have the same x co-ordinate, but different z co-ordinates, the axes of the tubes being parallel to each other and to y.

EXAMPLE 2

Figure 6:
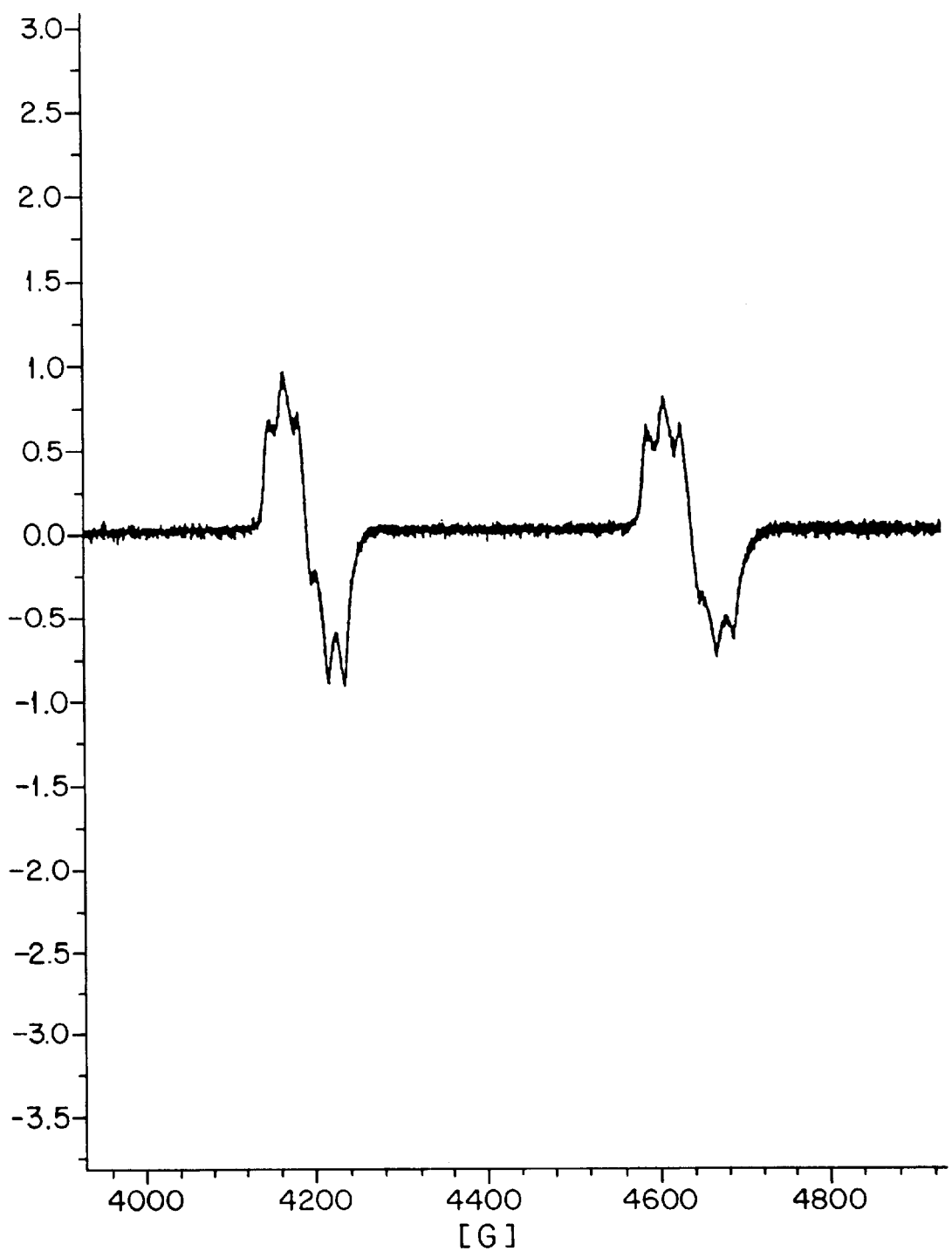
FIG. 6 represents an x-profile of 4-hydroxy-TEMPO, as per details in Example 2
Figure 7:
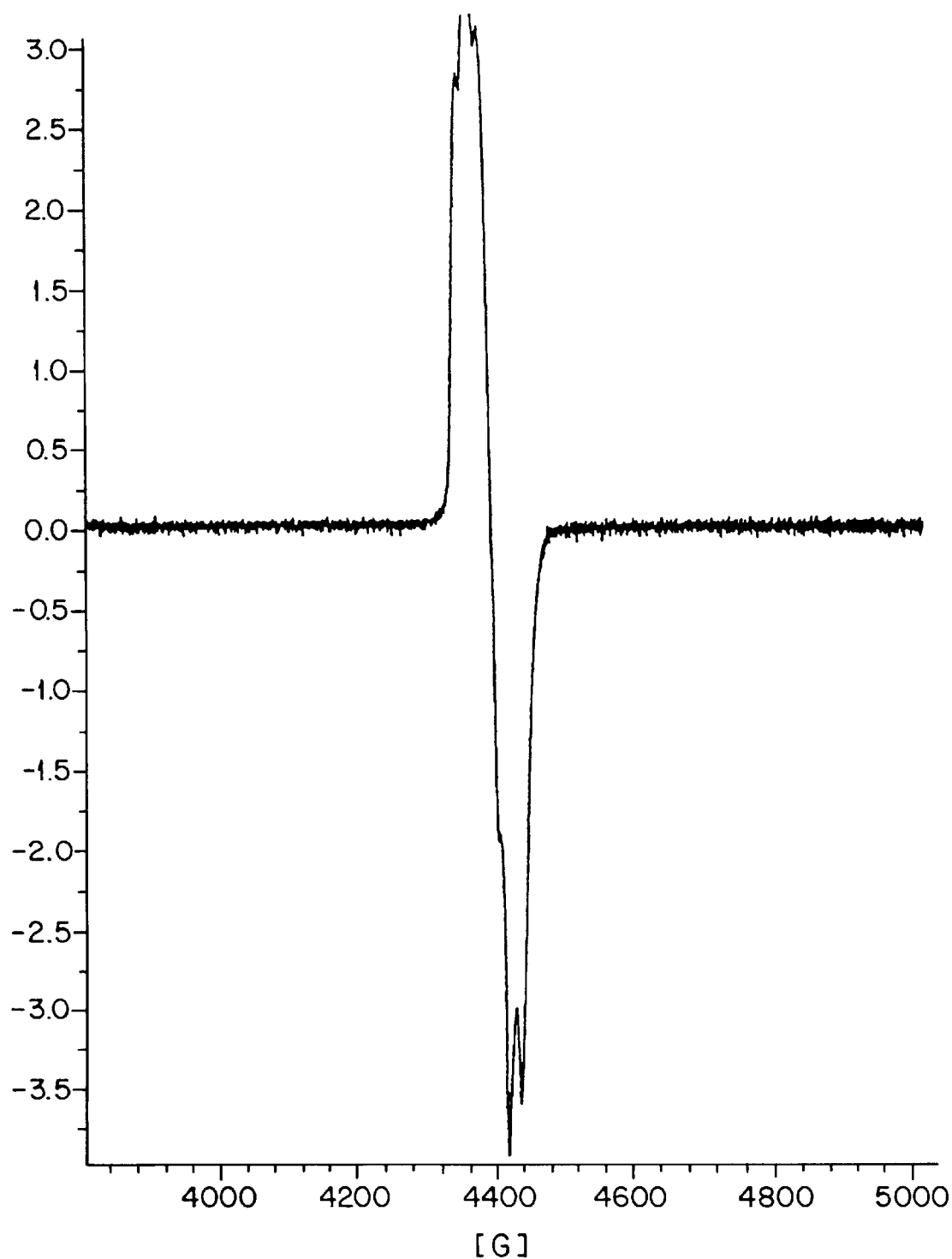
FIG. 7 represents a y-profile of 4-hydroxy-TEMPO, as per details in Example 2

0.25 ml of a solution of 4-hydroxy-TEMPO (TEMPO: 2,2,6,6-tetramethyl piperidine-1-oxyl radical) was taken in two short capillary tubes of diameter 2 mm, two short empty tubes of diameter 3 mm were interposed between the said 2 mm tubes, and the entire sample was placed in a dielectric resonator connected to a Bruker EMX 10/2.7 EPR spectrometer parallel to the magnetic field direction z, the field modulation being set to a frequency of 100 kHz and an amplitude of 4.0 G. The resonator was displaced 10 cm from the origin (center of the magnet) in the horizontal x direction, while being centered in the z and vertical y directions. The profile of the sample was obtained. The sample was then reoriented using a manual goniometer to 10° from the z-axis. The process was then repeated 18 times in a similar way, subjecting the sample to a reorientation of 10° each time, thereby getting 18 profiles. The profiles are processable using IDL software to get 3-dimensional image of the sample, in conformity with the morphology of the phantom object, after orthogonal mounting of the phantom followed by a similar rotation procedure as before. FIG. 6 and FIG. 7 represent typical x- and z-profiles, respectively.

EXAMPLE 3

Figure 8:
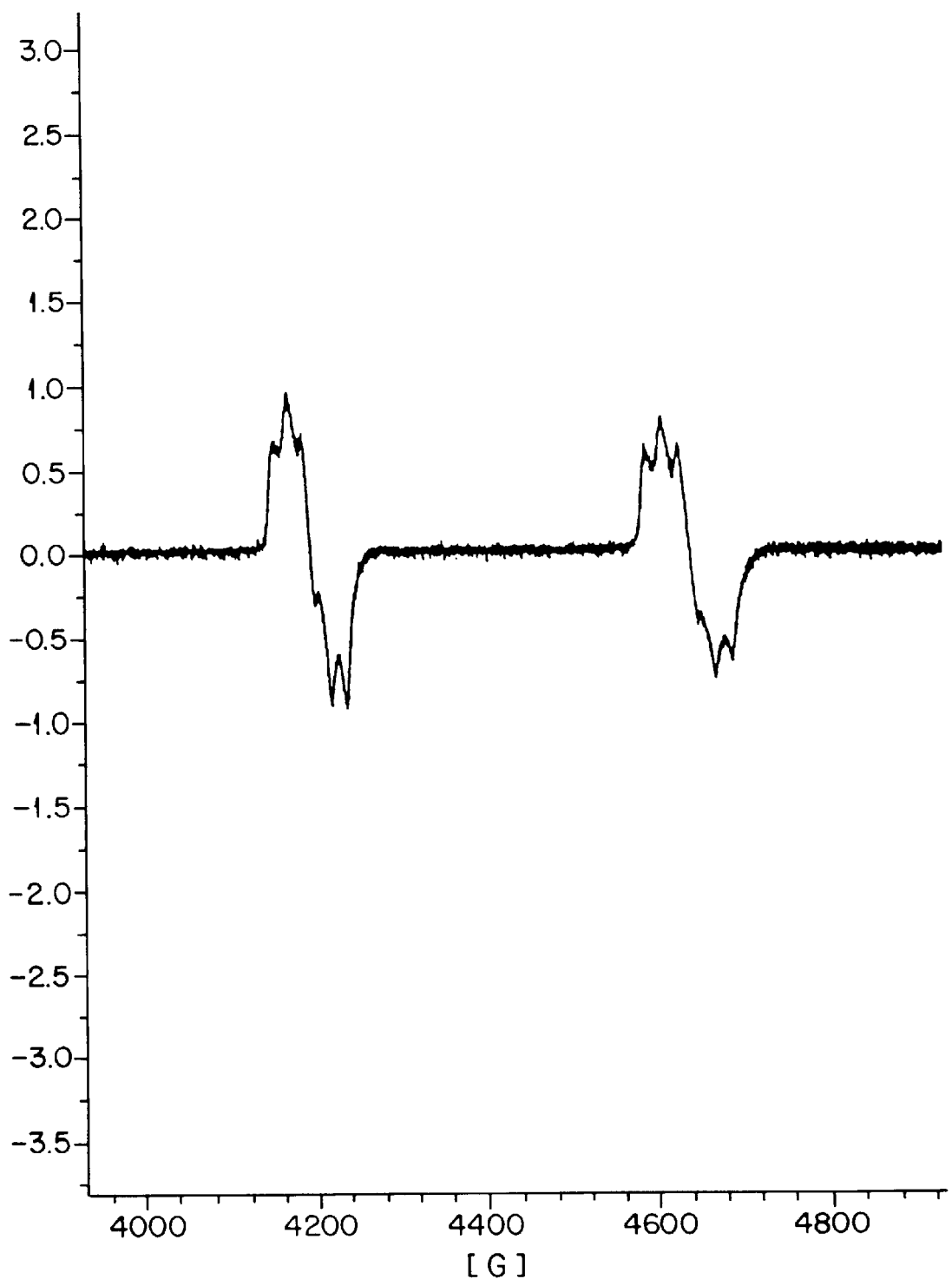
FIG. 8 represents an x-profile of 4-hydroxy-TEMPO, as per details in Example 3
Figure 9:
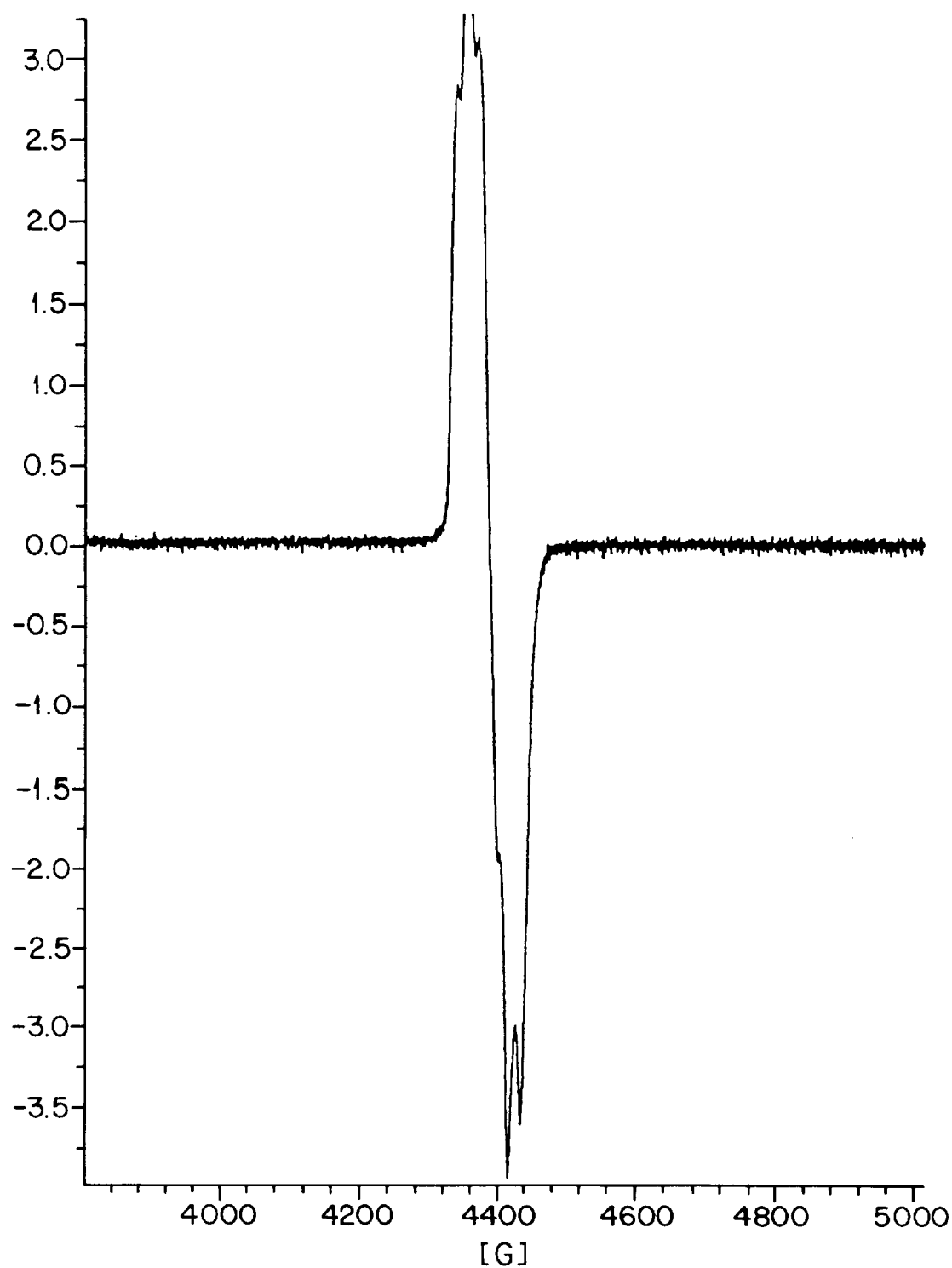
FIG. 9 represents a y-profile of 4-hydroxy-TEMPO, as per details in Example 3

0.25 ml of 4-hydroxy-TEMPO was taken in two capillary tubes of diameter 2 mm, two empty tubes of diameter 3 mm were interposed between the said 2 mm tubes, and the entire sample was placed in a cylindrical resonator connected to a Bruker EMX 10/2.7 EPR spectrometer parallel to the magnetic field direction z, the field modulation being set to a frequency of 100 kHz and an amplitude of 4 G. The resonator was displaced 10 cm from the origin (center of the magnet) in the horizontal x direction, while being centered in the z and vertical y directions. The profile of the sample was obtained. The sample was then reoriented using a manual goniometer to 10° from the z-axis. The process was then repeated 18 times in a similar way, subjecting the sample to a reorientation of 10° each time, thereby getting 18 profiles. The profiles are processable using IDL software to get 2-dimensional image of the sample, in conformity with the morphology of the phantom object. FIG. 8 and FIG. 9 represent typical x- and z-profiles, respectively.

The Main Advantages of the Present Invention are the Following

1. The device of the present invention provides for controlled and reproducible translation of the microwave bridge/resonator assembly in two or three orthogonal directions, in order to locate the resonator at the desired favorable position in the magnetic field.

2. The naturally occurring field gradient alone is used for EPR imaging by the present device.
3. The present device is devoid of gradient coils, gradient amplifiers and the associated cooling system for generating EPR images.
4. Field modulation amplitude is maintained below that of the linewidth of the sample.
5. Imaging of EPR samples like nitroxide radicals, having larger linewidth in the range of 1–10 MHz, is possible by using the device of the present invention.
6. The device permits acquisition of ESR images in cw mode, as well as in pulsed mode of operation.
7. The present invention provides a device for imaging on existing cw/pulsed EPR spectrometer/imaging systems, by the addition of a microwave bridge translation module, but without using gradient coils and amplifiers.

What is claimed is:

1. A device for Electron Paramagnetic Resonance Imaging, comprising a microwave bridge consisting of a source of electromagnetic radiation (23) in the microwave region, and attenuation and phase shift elements, the output of the said source (23) is connected to one arm of a Circulator or Magic Tee (24), another arm of which is coupled to a resonator (25) through an iris coupling, and the third arm being connected to a conventional microwave detector (27), the output of which is connected to one input of a phase sensitive detector (PSD) (28), whose second input is connected to one output of a conventional modulator (26), the second output of the said modulator (26) is fed to the modulation coils (32) associated with the resonator (25), the output of the PSD (28) being fed to an analog-to-digital converter (ADC) (29), whose output is connected to a Computer (30), the resonator (23) being placed in the magnetic field between the north pole and the south pole of a magnet (31), the microwave bridge translation module (33) adaptable for displacement of the bridge (23), circulator (24), resonator (25) with the sample and detector (27) in such a way that the resonator (25) is located optimally off-center in the magnetic field, the imaging being performed either in cw or in pulsed mode.

2. A device as claimed in claim 1, wherein the source of electromagnetic radiation used is selected from the group consisting of klystron, Gunn diode oscillator and Impact Avalanche and Transit Time (IMPATT) diode.

3. A device as claimed in claim 1, wherein the microwave detector is a diode detector.

4. A device as claimed in claim 1, wherein the resonator used is selected from the group consisting of slow wave helical structure, dielectric resonator, cylindrical resonator, rectangular resonator and slotted resonator.

5. A device as claimed in claim 1, wherein the field modulation amplitudes are in the range of 2–4 gauss.

6. A device as claimed in claim 1, wherein the means of orienting the sample comprises manually settable or computer controlled goniometer.

7. A device as claimed in claim 1, wherein the reorientation of the sample is carried out to vary polar angle or azimuth angle of the sample with respect to the magnetic field.

8. A device as claimed in claim 1, wherein the Electron Paramagnetic Resonance Imaging is done without using gradient coils.

9. A device as claimed in claim 1, wherein the Electron Paramagnetic Resonance Imaging is done without using gradient amplifier.

10. A device as claimed in claim 1, wherein the Electron Paramagnetic Resonance Imaging is done without using the cooling system associated with the gradient coil.

* * * * *